United States Patent
Cini et al.

(10) Patent No.: US 6,222,414 B1
(45) Date of Patent: Apr. 24, 2001

(54) BIPOLAR-PLUS-DMOS MIXED-TYPOLOGY POWER OUTPUT STAGE

(75) Inventors: Carlo Cini, Cornaredo; Fabrizio Stefani, Cardano al Campo, both of (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 08/351,578

(22) Filed: Dec. 7, 1994

(30) Foreign Application Priority Data

Dec. 7, 1993 (EP) .................................... 93830492

(51) Int. Cl.$^7$ ........................................ H03K 3/00
(52) U.S. Cl. ........................ 327/432; 327/108; 327/112
(58) Field of Search ................................ 327/108, 112, 327/432, 433; 326/44, 84, 85, 109, 110

(56) References Cited

U.S. PATENT DOCUMENTS

| | | | |
|---|---|---|---|
| 4,233,528 | * 11/1980 | Hogeboom | 327/432 |
| 4,331,887 | * 5/1982 | Jadus et al. | 327/108 |
| 4,546,370 | 10/1985 | Curran | 257/370 |
| 4,588,960 | 5/1986 | Salama et al. | 330/264 |
| 4,589,004 | 5/1986 | Yasuda et al. | 257/337 |
| 4,594,717 | 6/1986 | Bracht et al. | 372/26 |
| 4,716,310 | * 12/1987 | Tanizawa et al. | 326/110 |
| 4,717,849 | * 1/1988 | Shigekane | 327/432 |
| 4,774,420 | 9/1988 | Sutton et al. | 327/111 |
| 4,816,705 | * 3/1989 | Ohba et al. | 326/110 |
| 4,855,244 | 8/1989 | Hutter et al. | 257/370 |
| 4,887,142 | 12/1989 | Bertotti et al. | 257/338 |
| 4,896,196 | 1/1990 | Blanchard et al. | 257/139 |
| 4,949,142 | 8/1990 | Contiero et al. | 257/329 |
| 4,994,694 | * 2/1991 | Gross | 327/432 |
| 5,023,691 | 6/1991 | Hagino et al. | 257/139 |
| 5,027,250 | * 6/1991 | Cini et al. | 361/90 |
| 5,028,881 | 7/1991 | Spence | 330/253 |
| 5,041,895 | 8/1991 | Contiero et al. | 257/370 |

(List continued on next page.)

FOREIGN PATENT DOCUMENTS

| | | |
|---|---|---|
| 0349954A2 | 1/1990 | (EP) . |
| 928305069 | 4/1991 | (EP) . |
| 0451286A1 | 10/1991 | (EP) . |
| 3070477 | 3/1991 | (JP) . |
| 3-82216 | * 4/1991 | (JP) ............... 327/432 |
| 5-268032 | * 10/1993 | (JP) ............... 327/432 |

OTHER PUBLICATIONS

*Power Integrated Circuits: Physics, Design, and Applications*, Paolo Antognetti, Editor 1986, McGraw–Hill, Inc., Chapter 9, "Audio Amplifiers".

Aho et al., "Noise Optimization of BiCMOS Operational Amplifiers" 1990 IEEE International Symposium on Circuits and Systems, vol. 4, 3201–3204.

Miyazaki et al., "A Novel High Voltage Three–Phase Monolithic Inverter IC with Two Current Levels Sensing" IEEE Proceedings of the 3rd International Symposium on Power Semiconductor Devices and ICs, 1991, 248–53.

"Power Losses of the Cascode Connection Compared to a Single–Common–Emitter Bipolar Transistor" Electronic Engineering, Nov. 1981.

*Primary Examiner*—Kenneth B. Wells
(74) *Attorney, Agent, or Firm*—Theodore E. Galanthay; Allen, Dyer, Doppelt, Milbrath & Gilchrist, P.A.

(57) ABSTRACT

An output power stage which includes a PNP pull-up transistor and an n-channel FET push-down transistor, driven in phase opposition. This fully complementary stage provides an outstandingly improved power handling capability per semiconductor area occupied, together with a large output voltage swing, but does not require the use of externally connected discrete boot-strap components. The bipolar pull-up transistor can optionally be driven through an FET auxiliary stage, to minimize the power requirements of the preceding signal amplification stage.

14 Claims, 2 Drawing Sheets

U.S. PATENT DOCUMENTS

| | | | |
|---|---|---|---|
| 5,107,151 | 4/1992 | Cambier | 327/432 |
| 5,109,167 | 4/1992 | Montegari | 326/106 |
| 5,117,274 | 5/1992 | Mastroianni | 257/370 |
| 5,119,162 | 6/1992 | Todd et al. | 257/370 |
| 5,123,746 | 6/1992 | Okado | 363/37 |
| 5,155,572 | 10/1992 | Bonneau et al. | 257/583 |
| 5,231,563 | 7/1993 | Jitaru | 363/98 |
| 5,248,624 | 9/1993 | Icel et al. | 438/201 |
| 5,309,039 * | 5/1994 | Ghassemi et al. | 327/432 |
| 5,315,497 | 5/1994 | Severinsky | 363/34 |
| 5,317,180 | 5/1994 | Hutter et al. | 257/337 |
| 5,328,859 | 7/1994 | Vo et al. | 257/339 |
| 5,329,147 | 7/1994 | Vo et al. | 257/378 |
| 5,334,928 | 8/1994 | Dobkin et al. | 323/280 |
| 5,341,041 * | 8/1994 | El Gamal | 326/44 |
| 5,362,997 * | 11/1994 | Bloker | 326/64 |
| 5,376,833 * | 12/1994 | Chloupek | 327/110 |

* cited by examiner

BIPOLAR-PLUS-DMOS MIXED-TYPOLOGY POWER OUTPUT STAGE

FIELD OF THE INVENTION

The present invention relates to an output stage for an integrated power amplifier particularly suited for audio amplifiers.

BACKGROUND OF THE INVENTION

The output stages of power amplifiers are normally designed for maximizing the dynamic excursion of the output voltage (output voltage swing), by reducing as much as possible voltage drops due to the series resistance of the active components (transistors) that form the output stage. There is an ample specific bibliography out of which the volume "Power Integrated Circuit", published by Mc.Graw Hill, in 1986, pages 9.28–9.35 may be cited.

A widely used technique in power output stages is that of realizing a "bootstrap" line, using for this purpose a relatively large capacitance, that may be externally connected to the IC pins, in order to obtain the maximum peak-to-peak variation of the output voltage. Unfortunately, this technique conflicts with a general IC design trend of eliminating or reducing the need of passive external components to a minimum.

The known configurations of a power output stage are amply reported in literature and substantially are those employing a pair of transistors operating in phase opposition, namely an NPN/NPN, PNP/NPN, pMOS/nMOS and nMOS/nMOS pair. Of course, the selection of one of the above configurations depends on the fabrication technology that is employed, which determines also the maximum reverse voltage that can be withstood by the devices (for example the maximum VCE of bipolar junction transistors or the maximum VDS of MOS transistors).

Bipolar NPN transistors notably suffer from the problem connected to the so-called "secondary breakdown" phenomenon. Also bipolar PNP transistors are affected by this phenomenon but in a lesser measure than NPN transistors.

On the contrary, DMOS transistors are notably exempt from this problem.

In a mixed technology fabrication process (BJT, CMOS and DMOS) or BCD process, the power MOS transistors that can be realized in a compatible manner with the other type of integrated structures, have internal resistance characteristics that typically show the following values:

(n-channel) DMOS: Ron=0.5 $\Omega \times mm^2$
(p-channel) DMOS: Ron=2.2 $\Omega \times mm^2$ In particular, the solution of using a complementary pair of DMOS output transistors would appear an ideal choice, by considering also the advantage represented by the fact that the two output transistors would not need a driving current, being intrinsically voltage-controlled devices. However, a p-channel DMOS transistor requires an integration area that may be four times the integration area of an n-channel, complementary DMOS transistor, for the same Ron. Therefore the solution that employs a complementary pair of DMOS transistors is adopted only in a limited number of applications, where the relatively large silicon area requirement is not a problem.

On the other hand, the use of a (more compact) pair of transistors of the same polarity (that is noncomplementary), for example a pair of n-channel DMOS transistors, besides losing a portion equivalent to a VGS voltage of the maximum voltage swing of the output signal or otherwise requiring a bootstrap line, requires also a somewhat more complex driving circuit than the circuit that would be necessary for driving, in phase opposition, a complementary pair of output transistors.

There is a long felt need or utility of a complementary output stage with good breakdown characteristics that would not need externally connected bootstrap components and require a relatively large area of integration.

SUMMARY OF THE INVENTION

It has been found that in a normal BCD fabrication process it is possible to realize a bipolar PNP power transistor, having an internal resistance Ron of about 0.3 $\Omega \times mm^2$, which can be satisfactorily used as the high side part of a complementary output power stage that employs as its low side part, an n-channel field effect transistor.

A so configured output stage is perfectly complementary and therefore does not reduce the output dynamics by a VGS (or by a VBE) and may be driven by a relatively simple stage.

The output stage has an intrinsically high voltage swing characteristic and does not need externally connected boostrap components. The use of power transistors of different technology (a bipolar transistor of the high side or pull-up part and a field effect transistor for the low side or push-down part), permits to reach an outstandingly good compromise between the extent of silicon area necessary for integrating the two power transistors, by exploiting the relatively small size of an n-channel DMOS structure and of a vertical, isolated collector, PNP structure and the driving power requisite, which is required only by the active pull-up element constituted by the bipolar PNP transistor.

According to an alternative embodiment of the output stage of the invention, the pull-up power element, constituted by a bipolar PNP transistor, is driven by a stage composed of a field effect transistor, for example a p-channel MOS transistor, of sufficient size to provide the driving power required by the bipolar output transistor.

According to an embodiment of the invention, the PNP transistor may be constituted by a complex structure that comprises the PNP and NPN transistors, the electrical behavior of which can be equated to that of an equivalent PNP transistor. This solution permits to further reduce the integration area, being the power NPN structure of the PNP equivalent complex structure capable of operating at a higher current density than a PNP structure and therefore requiring a reduced area of integration. Of course, in this latter case, the output voltage swing would be reduced by a VBE but this could be advantageously traded-off with a maximized saving of silicon area.

BRIEF DESCRIPTION OF THE DRAWINGS

The different aspects and advantages of the output stage of the invention will become more evident through the following description of several embodiments and by referring to the annexed drawing, wherein.

DESCRIPTION OF PREFERRED EMBODIMENTS

Figure 1:
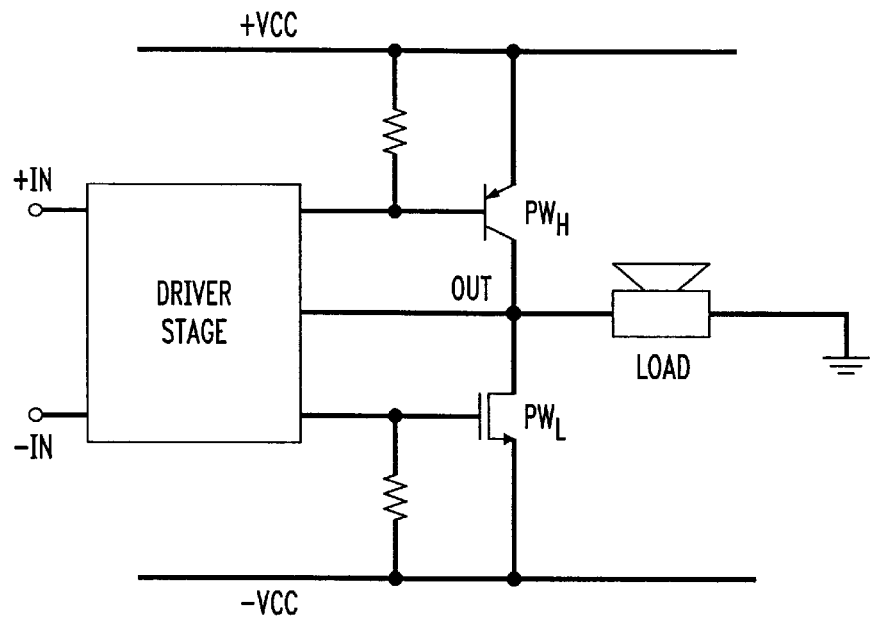
FIG. 1 is a circuit diagram of an output stage of the invention.

With reference to FIG. 1, the output stage of the invention is essentially constituted by a pull-up power element $PW_H$, composed of a bipolar PNP transistor, and by a push-down power element $PW_L$, composed of a DMOS transistor. The collector of $PW_H$ and the drain of $PW_L$ are connected in common to an output node OUT of the amplifier, which in this example is used to drive a loudspeaker. The complementary pair of transistors of the output stage is customarily driven by a suitable driving stage.

Of course, while the driving of the MOS transistor $PW_L$ occurs essentially in a voltage mode, with a practically null driving power, the driving of the high side element of the push-pull output stage, that is of the bipolar PNP transistor $PW_H$, requires a certain driving current (base current).

Figure 2:
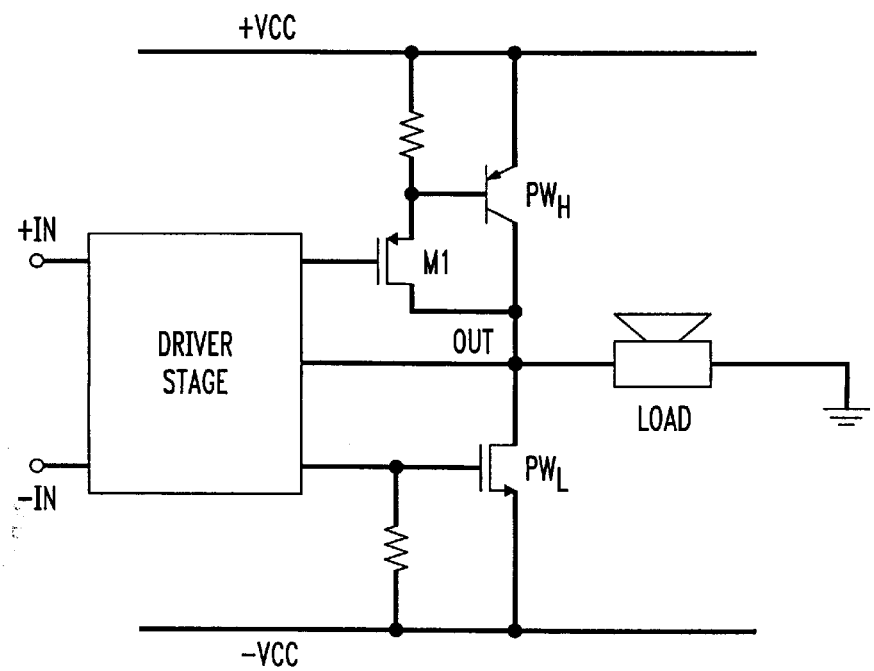
FIG. 2 is a circuit diagram of an output stage of the invention, according to an alternative embodiment thereof.

An alternative embodiment of the output stage of the invention is shown in FIG. 2, wherein a MOS transistor M1 is employed for driving the bipolar PNP transistor $PW_H$, so as to avoid loading the relative output node of the driver stage.

Figure 3:
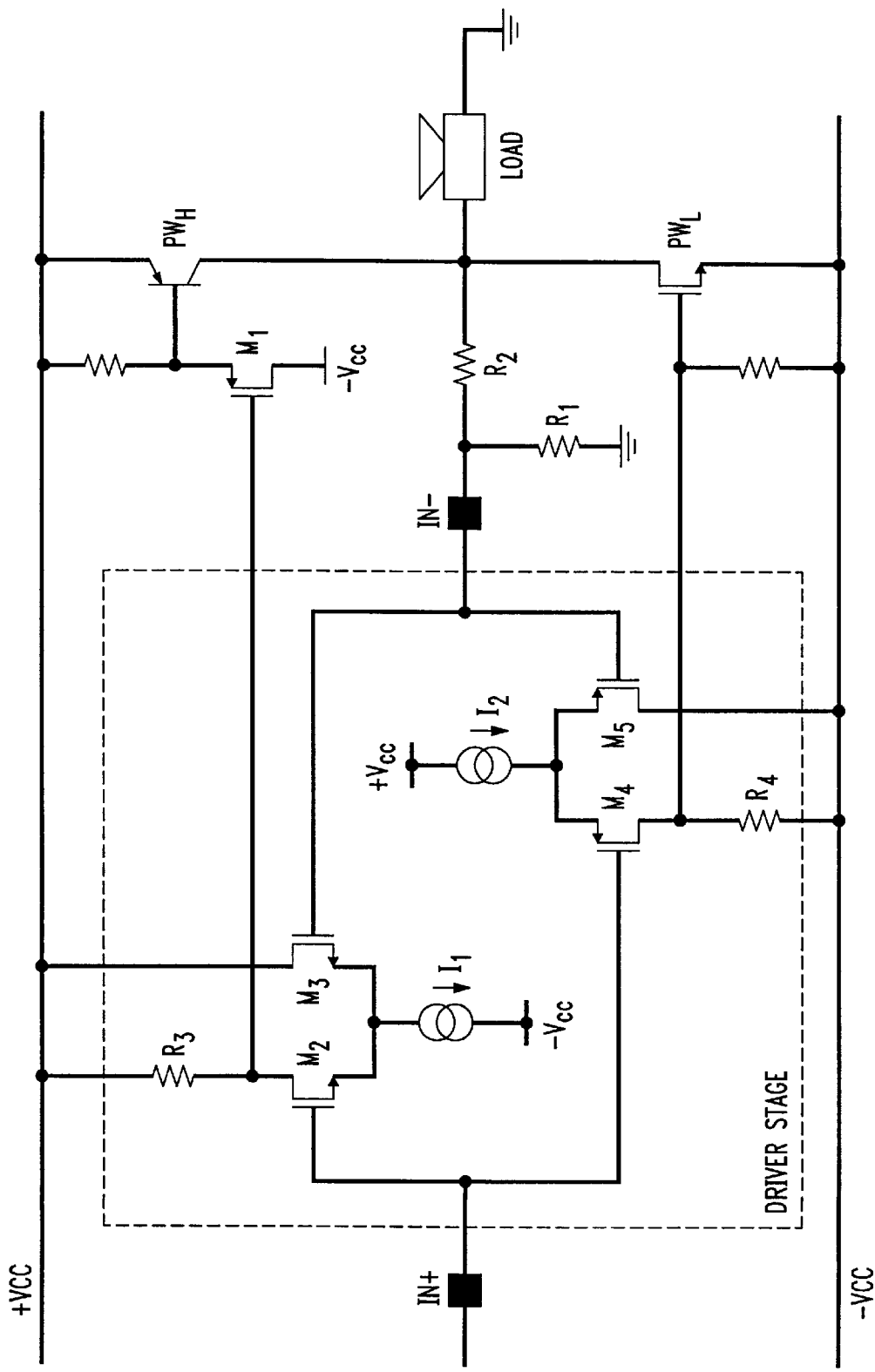
FIG. 3 is a more detailed circuit diagram of the output stage of FIG. 2.

A circuit diagram of the driver stage is depicted in FIG. 3. As may be observed, the driver stage may be realized with field effect transistors in a substantially symmetrical form. The high side part of the push-pull output stage, that is the power transistor $PW_H$ (driven through the MOS M1) is driven by the amplifier composed of R3, M2, M3 and the current generator I1. The low side part of the push-pull output stage, composed of the n-channel DMOS transistor $PW_L$ is driven by the amplifier composed of R4, M4, M5 and the current generator I2. In order to ensure compatibility to ground potential, the two resistances R1 and R2, connected between the IN-node and ground and between the IN-node and the load, respectively, determine the voltage gain.

What is claimed is:

1. An integrated power audio output stage comprising:
   a pair of transistors connected, in series with an output node, between a positive and a negative supply rail;
   a driver stage connected to drive said transistors in phase opposition;
   wherein said pair of transistors comprises a PNP bipolar pull-up transistor and an n-channel power field effect push-down transistor;
   wherein said output node is connected to a loudspeaker;
   wherein said driver stage is an analog differential amplifier.

2. The integrated power output stage of claim 1, wherein said PNP transistor is driven by a stage comprising a p-channel field effect MOS transistor.

3. The integrated power output stage of claim 1, wherein said PNP Transistor is an integrated, isolated collector, vertical transistor.

4. The integrated power output stage of claim 1, wherein said n-channel field effect transistor is a DMOS transistor.

5. The integrated power output stage of claim 1, further comprising an NMOS transistor connected to drive said PNP transistor.

6. An integrated circuit power audio output stage, comprising:
   a PNP integrated power bipolar transistor having a base terminal, a collector terminal operatively connected to an output node, and an emitter terminal operatively connected to a first supply rail;
   an N-channel power DMOS transistor having a gate terminal, a drain terminal operatively connected to said output node, and a source terminal operatively connected to a second supply rail which is more negative than said first supply rail;
   said base terminal and said gate terminal being interconnected so that said bipolar transistor and said DMOS transistor are driven in phase opposition;
   wherein said output node drives a loudspeaker.

7. The integrated power output stage of claim 6, further comprising a driver stage, integrated with said bipolar and DMOS transistors, which is connected to drive said base terminal of said bipolar transistor in phase opposition to said gate terminal of said DMOS transistor.

8. The integrated power output stage of claim 6, wherein said second supply rail has a voltage below ground voltage.

9. An integrated circuit power output audio stage, comprising:
   a PNP integrated power bipolar transistor having a base terminal, a collector terminal operatively connected to an output node, and an emitter terminal operatively connected to a first supply rail;
   an N-channel power DMOS transistor having a gate terminal, a drain terminal operatively connected to said output node, and a source terminal operatively connected to a second supply rail which is more negative than said first supply rail;
   an additional field-effect transistor, connected to drive said base terminal of said power bipolar transistor; and
   a driver circuit connected to drive said bipolar transistor and said DMOS transistor in phase opposition; said bipolar transistor being driven through said additional transistor;
   wherein said output node drives a loudspeaker.

10. The integrated circuit of claim 9, wherein said additional field-effect transistor is connected, in series with a resistor, between said supply rails.

11. The integrated circuit of claim 9, wherein said additional field-effect transistor is a p-channel transistor.

12. The integrated circuit of claim 9, wherein said additional field-effect transistor is a p-channel transistor, and has a drain thereof connected directly to said second power supply connection.

13. The integrated circuit of claim 9, wherein said driver circuit is an analog differential amplifier.

14. The integrated circuit of claim 9, wherein said second supply rail has a voltage below ground voltage.

* * * * *